United States Patent [19]

Peek

[11] Patent Number: 4,877,754
[45] Date of Patent: Oct. 31, 1989

[54] METHOD OF MANUFACTURING SEMICONDUCTOR DEVICE

[75] Inventor: Hermanus L. Peek, Eindhoven, Netherlands

[73] Assignee: U.S. Philips Corporation, New York, N.Y.

[21] Appl. No.: 173,003

[22] Filed: Mar. 31, 1988

Related U.S. Application Data

[62] Division of Ser. No. 507,409, Jun. 24, 1983, Pat. No. 4,763,185.

[30] Foreign Application Priority Data

Jul. 9, 1982 [NL] Netherlands .......................... 8202777

[51] Int. Cl.$^4$ ...................... H01L 21/00; H01L 21/02; H01L 21/283; H01L 21/31
[52] U.S. Cl. .................................... 437/195; 437/192; 437/193; 437/27
[58] Field of Search ......................... 437/192, 193, 195

[56] References Cited

U.S. PATENT DOCUMENTS

| 4,466,172 | 8/1984 | Batra | 357/54 |
| 4,625,391 | 12/1986 | Sasaki | 437/27 |

FOREIGN PATENT DOCUMENTS

| 0011359 | 1/1980 | Japan | 437/192 |
| 0060033 | 5/1981 | Japan | 437/192 |
| 0116628 | 9/1981 | Japan | 437/195 |
| 0011752 | 3/1983 | Japan | 437/195 |

Primary Examiner—Brian E. Hearn
Assistant Examiner—B. Everhart
Attorney, Agent, or Firm—John C. Fox

[57] ABSTRACT

A semiconductor device comprising a semiconductor body (1) having a surface (2) provided with a first insulating layer (3). On this layer is disposed a pattern of conductor strips (4) coated with insulation strips (5) with projecting edges (6). Under the edges (6), the conductor strips (4) are coated with insulating tracks (8) which fill the spaces under the edges (6) and which at least at the area where they adjoin the first insulating layer (3) can be etched selectively with respect to this layer (3). As a material for the conductor strips (4) use may be made of materials other than polycrystalline silicon, such as tungsten, molybdenum and silicides. The thickness of the first insulating layer (3) is affected to a very small extent during the manufacture of the device, while its depth remains unchanged.

9 Claims, 3 Drawing Sheets

METHOD OF MANUFACTURING SEMICONDUCTOR DEVICE

This is a division of application Ser. No. 507,409, filed June 24, 1983, now U.S. Pat. No. 4,763,185.

The invention relates to a semiconductor device comprising a semiconductor body having a surface which is coated at least in part with a first insulating layer, on which there is disposed a pattern of conductor strips which is coated with a corresponding pattern of insulation strips with edges projecting beyond the conductor strips, sides of the conductor strips present under the edges being coated with insulating tracks.

The invention further relates to a method of manufacturing such a device.

Such a device is, for example, a charge-coupled image sensor device, in which the first insulating layer is a gate dielectric and the conductor strips present thereon constitute gate electrodes. By supplying suitable voltage pulses to the gate electrodes, charge representative of an inage to be recorded can be stored in the semiconductor body and this charge can be transported through the semiconductor body.

A semiconductor device of the kind mentioned in the preamble is known from the European patent application No. 26376, in which the insulating tracks consist of silicon oxide. The known semiconductor device is manufactured by depositing on a surface of a silicon substrate provided with a silicon oxide layer a layer of conducting polycrystalline silicon and a second silicon oxide layer, after which the pattern of insulation strips is formed in the second silicon oxide layer, which pattern is then used in the process of providing by etching the corresponding pattern of conductor strips in the layer of polycrystalline silicon, which is under-etched so that the conductor strips exhibit exposed sides which are disposed under edges of the insulation strips. Subsequently, the conductor strips of polycrystalline silicon are provided with insulating tracks by converting the exposed polycrystalline silicon into silicon oxide at a high temperature by thermal oxidation.

In the known semiconductor device described, the choice of conducting materials for the manufacture of the conductor strips is limited to polycrystalline silicon, as a result of which only conductor strips having a comparatively high resistance can be obtained. A further disadvantage of the known semiconductor device described is that the insulating tracks are manufactured by thermal oxidation of polycrystalline silicon. During this treatment, parts of the silicon oxide layer present on the surface of the silicon substrate which lie between the conductor strips are oxidized further, as a result of which the thickness and the depth in the substrate increase. When at this area a second pattern of conductors is formed, electrical pulses at this second pattern will influence charges present in the substrate in another manner than electrical pulses at the first pattern. This is undesirable.

The invention has inter alia for its object to provide a semiconductor device, in which the choice of the conducting materials for the manufacture of the conductor strips is not laminated to polycrystalline silicon and in which the thickness of the first insulating layer is locally influenced only to a small extent during the manufacture of the semiconductor device, while its depth remains unchanged.

According to the invention, a semiconductor device of the kind mentioned in the preamble is therefore characterized in that the insulating tracks fill the spaces under the edges of the insulation strips and at least at the area where they adjon the sides of the conductor strips and the first insulating layer consist of a material which can be etched selectively with respect to the first insulating layer.

The semiconductor device according to the invention can be manufactured in a similar manner as the known device described, except that the sides of the conductor strips are not provided with insulation tracks by thermal oxidation of polycrystalline silicon, but by depositing on the surface a third insulating layer which fills spaces lying under the edges of the insulation strips, while at least the part of the latter layer formed at the beginning of the deposition can be etched selectively with respect to the first insulating layer. Subsequently, the third insulating layer can be etched away from the parts of the first insulating layer adjacent the insulation strips, the thickness and the depth of the latter layer being influenced only to a small extent. With the use of this method, the choice of the material for the conductor strips is not limited either to polycrystalline silicon, but use may also be made of metals, such as tungsten and molybdenum, as well as of silicides of these metals. Thus, conductor strips can be obtained which have a considerably lower resistance than those made of polycrystalline silicon.

A preferred embodiment of the semiconductor device according to the invention is characterized in that the insulating tracks have a homogeneous cross-section. This semiconductor device can be manufactured in a very simple manner, because the third insulating layer can be provided in a single step in the form of a homogeneous layer on the surface of the semiconductor body, while third insulating layer can be etched away from the first insulating layer also in a single step.

Another preferred embodiment of the semiconductor device according to the invention is characterized in that the insulating tracks have a cross-section with a core made of the same material as the first insulating layer, and with an edge adjoining the conductor strips and the first insulating layer and made of a material which can be etched selectively with respect to the first insulating layer. This semiconductor device can be manufactured by depositing on the surface of the semiconductor body a double layer, the first deposited part of which can be etched selectively with respect to the first insulating layer and the other part of which consists of the same material as the second insulating layer. Subsequently, this double layer can be removed from the first insulating layer by two successive etching treatments, the first deposited part of the third layer serving as an etching stopper when the last deposited part of the third layer is removed. The first deposited part of the third layer can therefore be very thin so that the insulating tracks on the sides of the conductor strips practically have the same material composition as the insulation strips above the conductor strips. As a result, the occurrence of mechanical stresses is counteracted.

The conductor strips and the insulating tracks of the semiconductor device according to the invention preferably consists of a material deposited from a gaseous phase at a reduced pressure and chosen from silicon oxide and silicon nitride. These materials not only can be very readily etched with respect to each other, but they have also favourable insulating properties.

The invention further relates to a method of manufacturing a semiconductor device, in which there are deposited on a surface of a semiconductor body provided with a first insulating layer a layer of conducting material and a second insulating insulating layer, after which a pattern of insulation strip is formed in the second insulating layer, which pattern is then used as a mask in the process of providing by etching a corresponding pattern of conductor strips in the layer of conducting material, which is underetched so that the conductor strips exhibit exposed sides which lie under edges of the insulating strips, after which the exposed sides are provided with insulating tracks.

A method of the kind mentioned above is known from the European patent application No. 26,376, in which the first and the second insulating layers are made of silicon oxide and the conductor strips are made of polycrystalline silicon. The sides of the conductor strips are provided with insulating tracks by converting the exposed polycrystalline silicon into silicon oxide at a high temperature by thermal oxidation.

By this known method, only insulated conductor strips of polycrystalline silicon can be manufactured. Further, during the thermal oxidation of the sides of the conductor strips, the parts of the first insulating layer not coated with polycrystalline silicon will continue to oxidize and thus will increase in thickness.

The invention has of its object inter alia to provide a method in which the said disadvantages are mitigated.

According to the invention, a method of the aforementioned kind is therefore characterized in that the insulating tracks are provided by depositing on the assembly a third insulating layer which fills spaces lying under the insulation strips, while at least the part of the third interlating layer formed at the beginning of the deposition can be etched selectively with respect to the first insulating layer, after which the third insulating layer is etched until parts of the first insulating layer adjacent the insulation strips are exposed again. By the use of this method, the choice of the material for the conductor strips is not limited to polycrystalline silicon, but use may also be made of metals, such as tungsten and molybdenum, as well as of silicides of these metals. Due to the said etching selectivity, it is possible to provide the insulating tracks on the sides of the conductor strips so that the thickness of the parts of the first insulating layer adjacent the conductor strips is influenced only to a small extent, whilst their depth remains unchanged.

A preferred embodiment of a method according to invention is characterized in that as the third insulating layer a homogeneous layer is provided which is made of a material which can be etched selectively with respect to the first insulating layer. This method is very simple because the third insulating layer can be both provided and etched away in a single step.

Another preferred embodiment of the method according to the invention is characterized in that as the third insulating layer a double layer is provided, the first deposited part of which can be etched selectively with respect to the first insulating layer and the other part of which consists of the same material as the first insulating layer.

A semiconductor device thus manufactured has insulation tracks on the sides of the conductor strips which, apart from a thin edge, are made of the same material as the first insulating layer. Consequently, the occurrence of mechanical stresses is counteracted.

Preferably, the second and the third insulating layers are manufactured by depositing insulating material from a gaseous phase at a reduced pressure, the insulating material being chosen from silicon oxide and silicon nitride. In this manner, the spaces under the insulation strips are filled satisfactorily, while the materials can be readily etched selectively with respect to each other.

The invention will now be described more fully byy way of example with reference to a drawing. In the drawing.

The figures are schematic and not drawn to scale, whilst for the sake of clarity in particular the dimensions in the direction of thickness are greatly exaggerated. In the figures, corresponding parts are designated by like reference numerals.

Figure 1:
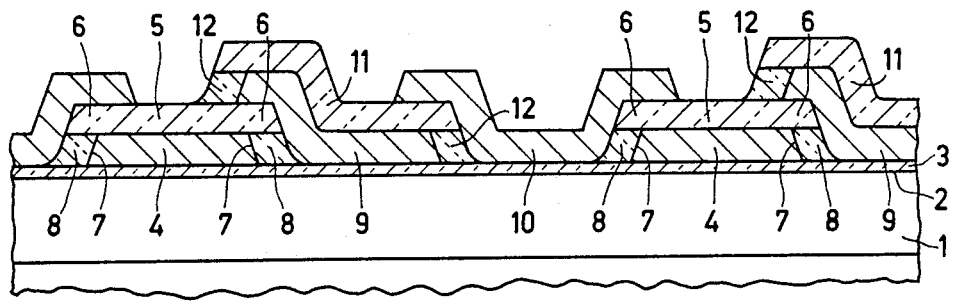
FIG. 1 shows a cross-section of a relevant part of a first embodiment of a semiconductor device according to the invention.
Figure 2:
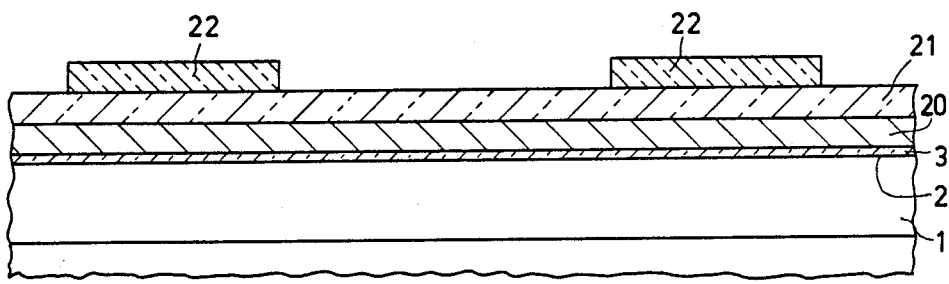
FIG. 2 to FIG. 8 show successively a few stages during the manufacture of the device shown in FIG. 1.
Figure 3:
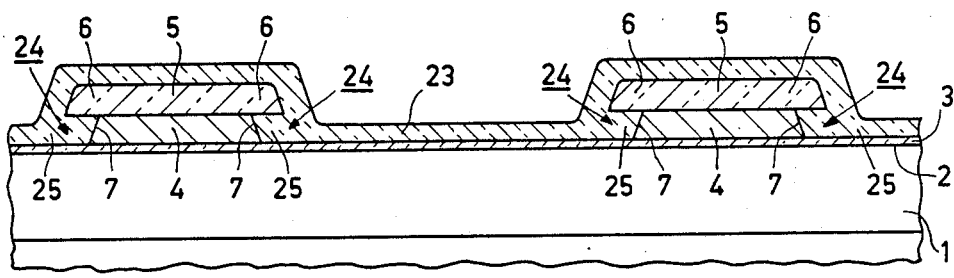
Figure 4:
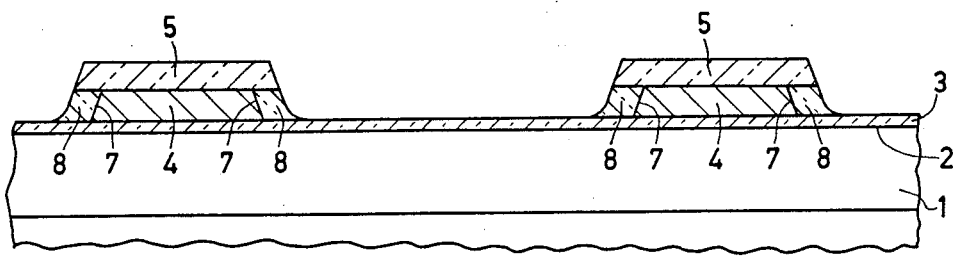
Figure 5:
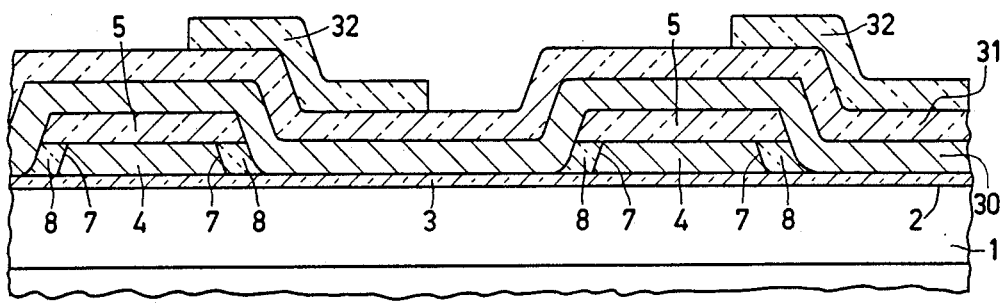
Figure 6:
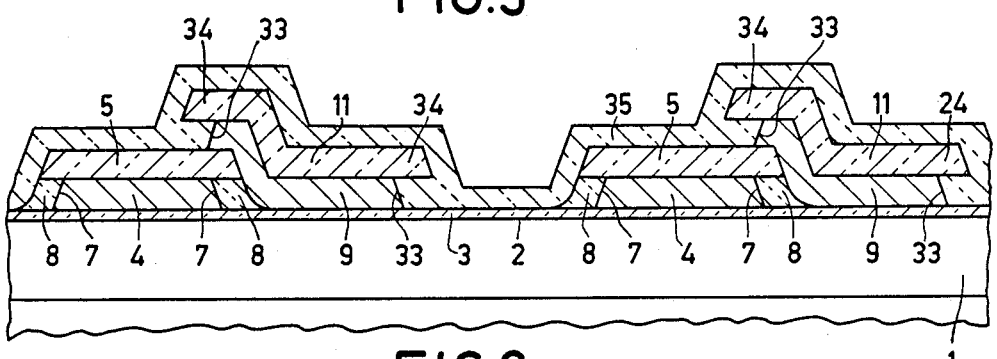
Figure 7:
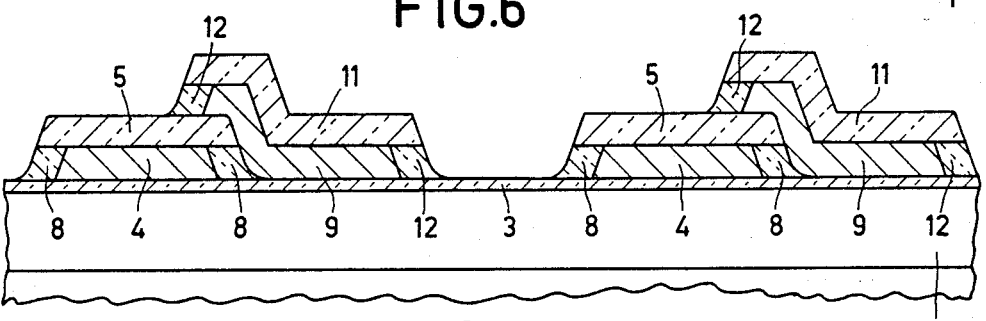
Figure 8:
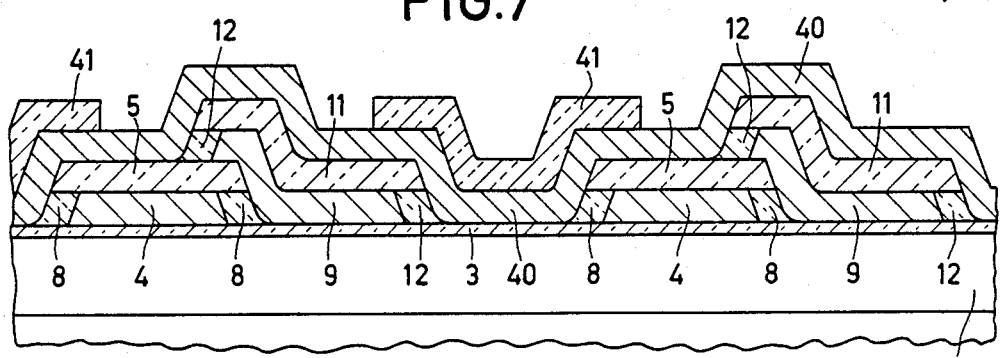

FIG. 1 shows a cross-section of a semiconductor device comprising a semiconductor body having an upper layer 1 of 1 $\mu$m thickness having a surface doping of approximately $10^{17}$ atoms per $cm^3$ and a surface 2 which is coated at least in part with a first insulating layer 3 of, for example, silicon oxide having a thickness of approximately 100 nm. There is provided on the first insulating layer a pattern of conductor strips 4, which is coated with a corresponding pattern of insulation strips 5 with edges 6 which project beyond the conductor strips. Sides 7 of the conductor strips 4 present under the edges 6 are coated with insulating tracks 8. The insulating tracks 8 fill the spaces under the edges 6 of the insulation strips 5 and at least at the area where they adjoin the sides of the conductor strips and the first insulating layer 3 they consist of a material which can be etched selectively with respect to the first insulating layer 3. As will appear hereinafter, the conductor strips 4 can consequently be insulated completely by the insulating tracks 8 and the insulation strips 5, the thickness of the parts of the first insulating layer 3 adjacent the conductor strips 4 being influenced only to a small extent. As will further appear, provision may further be made of patterns of conductor strips 9 and 10, the first insulating layer 3 having a substantially uniform thickness throughout between the conductor strips 4, 9 and 10 and the surface 2 of the semiconductor body. The conductor strips 9 may be insulated in the same manner as the conductor strips 4 by insulation strips 11 and insulating tracks 12. The conductor strips 10 may be insulated by an insulating layer (not shown for the sake of clarity), which covers the whole surface. The insulating layer 3 has a uniform thickness throughout.

The semiconductor device shown in FIG. 1 is, for example, a part of an image sensor device, the first insulating layer 3 being a gate dielectric and the conductor strips 4, 9 and 10 present thereon constituting gate electrodes. Since the gate dielectric has the same depth throughout and has substantially the same thickness under all the gate electrodes, electrical pulses at these gate electrodes will influence charges present in the substrate in the same manner; therefore, the gates will have equal threshold voltages. This is of great importance for satisfactory operation of the image sensor device.

FIGS. 2 to 8 show a method of manufacturing the semiconductor device of FIG. 1 a layer of conducting material 20 made of polycrystalline silicon having a thickness of approximately 250 nm and a second insulating layer 21 of silicon oxide having a thickness of approximately 250 nm being formed on a surface 2 of a semiconductor body with an 1 $\mu$m thick n-type upper layer 1 having a surface doping of approximately $10^{17}$ atoms per cm$^3$, which surface is provided with a first insulating layer 3—in this example a layer of silicon oxide having a thickness of approximately 100 nm. With the aid of a photoresist mask 22 and an etching treatment, a pattern of insulation strips 5 is formed in the second insulating layer 21. This pattern of insulation strips 5 then serves as a mask in the process of forming by etching a corresponding pattern of conductor strips 4 in the layer of conducting material 20, which is then under-etched so that the conductor strips exhibit exposed sides 7 which are located under edges 6 of the insulation strips 5 having a width of approximately 250 nm. Subsequently, the sides 7 are provided with insulating tracks 8 by depositing on the assembly a third insulating layer 23, which fills spaces 24 present under the edges 6 of the insulation strips 5, while the part 25 of the latter layer formed at the beginning of the deposition can be etched selectively with respect to the first insulating layer 3. The third insulating layer 23, which in this example consists of silicon nitride and has a thickness of approximately 150 nm, is then etched until parts of the first insulating layer 3 adjacent the insulation strips 5 are exposed again.

Since the sides 7 are provided with insulating tracks 8 by depositing on the assembly a third insulating layer 23 and etching the latter away again except in the spaces 24 under the edges 6 of the insulation strips 5, the choice of the material for the conductor strips 4 is not limited to polycrystalline silicon. Use may also be made of metals, such as tungsten and molybdenum, as well as of silicides of these metals for the manufacture of the conductor strips 4. Thus, conductor strips can be obtained, which have a considerably lower resistance than those of polycrystalline silicon. This is of great importance for a further miniaturisation of such semiconductor devices.

The third insulating layer 23 of silicon nitride can be very readily etched selectively with respect to the first insulating ayer 3 of silicon oxide in hot phosphoric acid, but also in constituents of a plasma formed in a gas mixture of tetrafluoromethane (90% by volume), trifluorobromomethane (5% by volume) and oxygen (5% by volume) this can be effected successfully. In both cases, the etching treatment is carried out isotropically, that is to say that from parts of the third insulating layer 23 which are at right angles to the surface 2, an equally large quantity is etched away as from parts which extend parallel thereto. The etching treatment is stopped when the first insulating layer 3 between the insulation strips 5 is exposed again, as a result of which the insulating tracks 8 assume the form shown in FIG. 4. Due to the high etching selectivity, the first insulating layer 3 hardly becomes thinner. Its depth remains unchanged.

Subsequently, the process is repeated for forming the next pattern of conductor strip 9. For this purpose, the assembly comprising the exposed first insulating layer 3, the insulation strips 5 and the insulating tracks 8 is coated with a layer of conducting material 30, in this case of polycrystalline silicon, again having a thickness of approximately 250 nm, and with an insulating layer 31 of silicon oxide, also again having a thickness of approximately 250 nm. With the aid of a photoresist mask 32 and an etching treatment, a pattern of insulation strips 11 is formed in the insulating layer 31. This pattern of insulation strips 11 again serves as a mask in the process of forming by etching a corresponding pattern of conductor strips 9 in the layer of conducting material 30, which is then under-etched so that the conductor strips 9 exhibit exposed sides 33, which are located under edges 34 of the insulation strips 11. The sides 33 are then provided with insulating tracks 12 by depositing on the assembly an insulating layer 35, which fills spaces present under the edges 34 of the insulation strips 11, while at least the part of the latter layer formed at the beginning of the deposition can be etched selectively with respect to the first insulating layer 3. Subsequently, the insulating layer 35, which in this example consists of silicon nitride and has a thickness of approximately 150 nm, is etched until the parts of the first insulating layer 3 adjacent the insulation strips 11 and 5 are exposed again. Finally, before the conductor strips 10 are formed, a conducting layer 40 of polycrystalline silicon having a thickness of 250 nm is applied to the whole structure then obtained, in which the conductor strips 10 are then formed with the aid of a photoresist mask 41 and etching treatment. Thus, the semiconductor device shown in FIG. 1 is obtained.

In the embodiment shown in FIGS. 1 to 8, the insulating tracks 8 and 12 have a homogeneous cross-section. This semiconductor device can be manufactured in a very simple manner in that in a single step the third insulating layer 23 of a material which can be etched selectively with respect to the first insulating layer 3 is deposited as a homogeneous layer. In the example, the third layer consists of silicon nitride. This layer can then be removed down to the insulating layer 3 by means of a single etching step in, for example, hot phosphoric acid.

Figure 9:
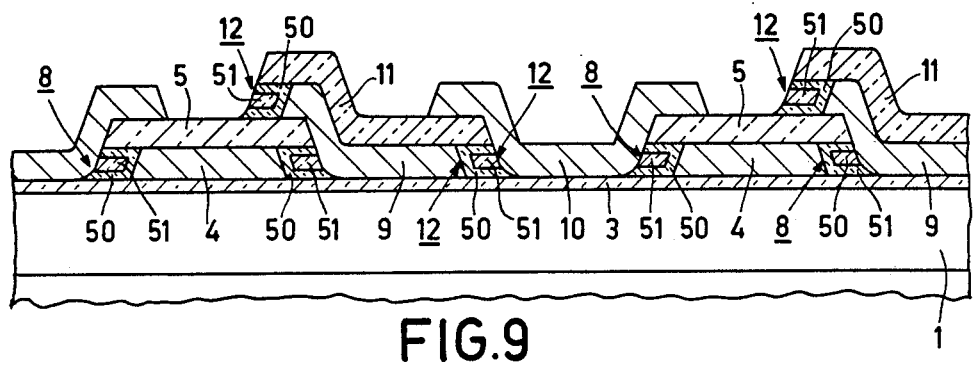
FIG. 9 shows a cross-section of a relevant part of another embodiment of a semiconductor device according to the invention.

FIG. 9 shows in cross-section another embodiment, in which the insulating tracks 8 and 12 have a cross-section with an edge 50 adjoining the conductor strips 4 and 9 and made of a material which can be etched selectively with respect to the first insulating layer 3, in this example silicon nitride, having a thickness of approximately 40 nm, and with a core of the same material as the first insulating layer 3, which in this case consists of silicon oxide. The edges 50 of the insulating tracks 8 and 12 are comparatively thin so that the tracks 8 and 12 have a composition which hardly deviates from the insulating layer 3 and the insulating strips 5 and 11. As a result, the occurrence of mechanical stresses is counteracted.

Figure 10:
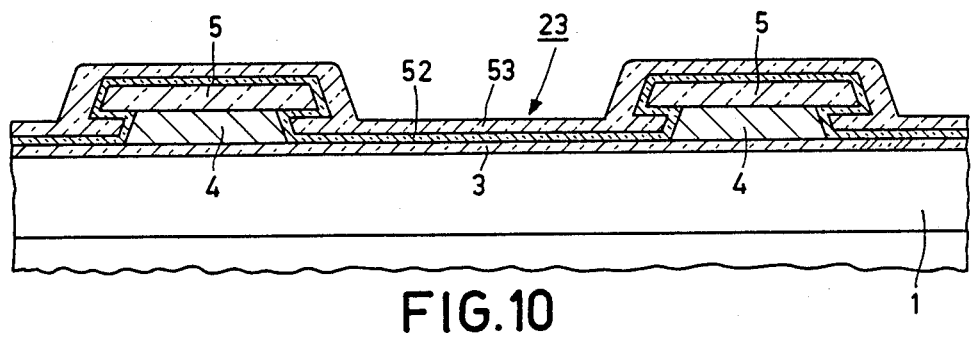
FIG. 10 to FIG. 12 show successively a few stages during the manufacture of the device shown in FIG. 9.
Figure 11:
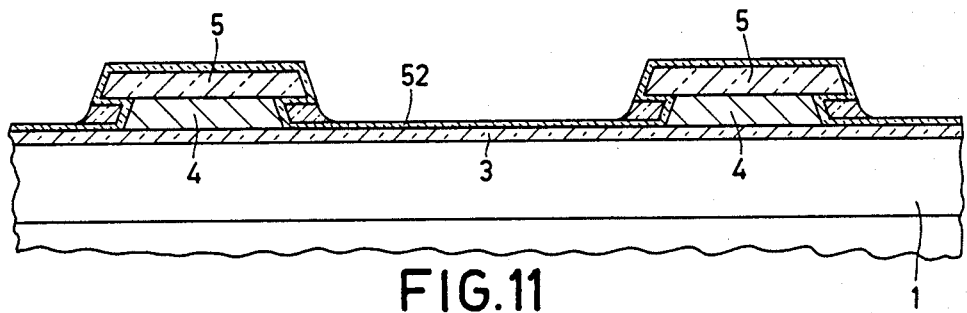
Figure 12:
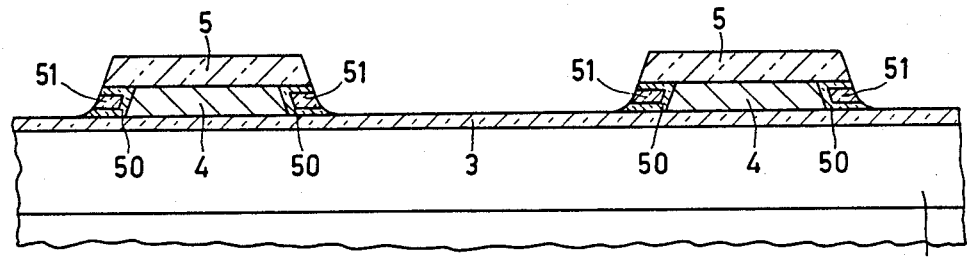

FIGS. 10 to 12 show a few stages of the manufacture of the device shown in FIG. 9. In the same manner as with the device shown in FIG. 1, three patterns of conductor strips 4 and insulation strips 5 are formed on the first insulating layer 3. Subsequently, the third insulating layer 23 is deposited thereon as a double layer, the first deposited part 52 of which—in this example of silicon nitride—can be etched selectively with respect to the first insulating layer 3 and the other part 53 of which consists of the same material as the first insulating layer 3. The double layer 52, 53 is then removed from the first layer 3 beside the insulation strips 5 by two etching treatments. First the layer 53 is removed from the layer 52 by an isotropic etching treatment in a buffered hydrofluoride etching bath and then the layer 52 is removed by an isotropic etching treatment, in this example in hot phosphoric acid. Finally, the structure as shown in FIG. 12 is obtained. In an analogous manner, also the insulating tracks 12 can be provided. As has already been stated, in a device manufactured in this manner, the occurrence of mechanical stresses is counteracted.

The insulation strips 5 and 11 and the insulating tracks 8 and 12 consist of a material deposited from a gaseous phase at a reduced pressure chosen from silicon oxide and silicon nitride. As a result, it is achieved that the conductor strips 4, 9 and 10 are satisfactorily insulated from each other. When the second and the third insulating layers 21 (31) and 23 (35), respectively, are manufactured by depositing an insulating material from a gaseous phase at a reduced pressure, silicon oxide or silicon nitride being chosen as insulating material, it is achieved that the spaces under the edges 6 and 34 of the insulation strips 5 and 11 are filled, while the chosen materials can be readily etched with respect to each other.

The first insulating layer 3 and the insulation strips 5 and 11 consist of silicon oxide, while the insulating tracks 8 and 12 at least at the area where they adjoin the sides 7 and 33 of the conductor strips 4 and 9 and the first insulating layer 3 consist of silicon nitride. As a result, in addition to the favourable properties already mentioned above, the device has the particular advantage that the first insulating layer 3, which constitutes the gate dielectric of the device, consists of silicon oxide. This dielectric can therefore be made 100 nm or thinner whilst maintaining favourable electrical properties, which is of importance for a further miniaturisation of such semiconductor devices. A gate dielectric consisting of silicon nitride may also be used. The first insulating layer 3 and the insulation strips 5 and 11 then consist of silicon nitride, while the insulating tracks 8 and 12 at least at the area where they adjoin the sides 7 and 33 of the conductor strips 4 and 9 and the first insulating layer 3 then consist of silicon oxide. As a result, the device also has the advantages mentioned above, but it has the disadvantage that the gate dielectric has to be comparatively thick. For in this case, the first insulating layer 3 has to be applied to the substrate 1 through an intermediate layer of silicon oxide. Since in operation, electric charge is collected in the proximity of the interface of oxide and nitride, the overall thickness of the two layers together constituting the gate dielectric has to be comparatively large in order to avoid that this charge adversely affects the operation of the device.

The aforementioned semiconductor device can be manufactured in a simple manner by making the first and the second insulating layers 3 and 21, respectively, of silicon oxide, while the part of the third insulating layer 23 formed at the beginning of the deposition—in the embodiment shown in FIG. 1 a first part 25 of a homogeneous layer and in the embodiment shown in FIG. 9 the part 52 of a double layer—is made of silicon nitride.

It should further be appeciated that the invention is not limited to these embodiments, but that a large number of modifications are possible for those skilled in the art without departing from the scope of the invention. For example, semiconductor materials other than silicon may be used. It is also possible to use instead of the said silicon oxide and the silicon nitride other insulating materials, which can be etched selectively with respect to each other.

What is claimed is:

1. A method of manufacturing a semiconductor device on a surface of a semiconductor body provided with a first insulating layer, the method comprising the steps of: (a) providing a layer of conducting material and a second insulating layer on the surface, (b) forming a pattern of insulating strips in the second insulating layer, (c) using the pattern as a mask while etching a corresponding pattern of conductor strips in the layer of conducting material, (d) underetching the corresponding pattern so that the conductor strips exhibit exposed sides which are located under edges of the insulating strips, (e) providing the exposed sides with insulating tracks, characterized in that the insulating tracks are provided by depositing on the assembly a third insulating layer, which fills spaces located under the edges of the insulating strips, and in that at least a part of the third insulating layer is etched selectively with respect to the first insulating layer, until parts of the first insulating layer adjacent the insulation strips are exposed again.

2. A method as claimed in claim 1, in which the third insulating layer is a homogeneous layer of a material which can be etched selectively with respect to the first insulating layer.

3. A method as claimed in claim 1, in which the third insulating layer is a double layer, the first deposited part of which can be etched selectively with respect to the first insulating layer and the second part of which consists of the same material as the first insulating layer.

4. A method as claimed in claim 3, in which the second and third insulating layers are manufactured by depositing an insulating material chosen from silicon oxide and silicon nitride from a gaseous phase at a reduced pressure.

5. A method as claimed in claim 4, in which the first and the second insulating layers are made of silicon oxide, while the part of the third insulating layer formed at the beginning of the deposition is made of silicon nitride.

6. A method as claimed in claim 2, in which the second an third insulating layers are manufactured by depositing an insulating material chosen from silicon oxide and silicon nitride from a gaseous phase at a reduced pressure.

7. A method as claimed in claim 6, in which the first and the second insulating layers are made of silicon oxide, while the part of the third insulating layer formed at the beginning of the deposition is made of silicon nitride.

8. A method as claimed in claim 1, in which the second and third insulating layers are manufactured by depositing an insulating material chosen from silicon oxide and silicon nitride from a gaseous phase at a reduced pressure.

9. A method as claimed in claim 8, in which the first and the second insulating layers are made of silicon oxide, while the part of the third insulating layer formed at the beginning of the deposition is made of silicon nitride.

* * * * *